(12) United States Patent
Farnworth et al.

(10) Patent No.: US 6,404,063 B2
(45) Date of Patent: Jun. 11, 2002

(54) DIE-TO-INSERT PERMANENT CONNECTION AND METHOD OF FORMING

(75) Inventors: Warren M. Farnworth, Nampa; Alan G. Wood, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/915,236

(22) Filed: Jul. 25, 2001

Related U.S. Application Data

(62) Division of application No. 09/565,862, filed on May 5, 2000, which is a continuation of application No. 08/736,586, filed on Oct. 24, 1996, now Pat. No. 6,133,638, which is a division of application No. 08/578,493, filed on Dec. 22, 1995, now Pat. No. 5,686,318.

(51) Int. Cl.$^7$ ............................................. H01L 23/48
(52) U.S. Cl. ..................... 257/778; 257/723; 257/737
(58) Field of Search ................... 257/778, 779, 257/780, 737, 738, 723

(56) References Cited

U.S. PATENT DOCUMENTS

| | | |
|---|---|---|
| 3,621,564 A | 11/1971 | Tanaka et al. |
| 3,753,290 A | 8/1973 | Zandonatti |
| 4,293,637 A | 10/1981 | Hatada et al. |
| 4,693,770 A | 9/1987 | Hatada |
| 4,899,107 A | 2/1990 | Corbett et al. |
| 4,930,001 A | 5/1990 | Williams |
| 5,180,974 A | 1/1993 | Mitchell et al. |
| 5,189,505 A | 2/1993 | Bartelink |
| 5,249,450 A | 10/1993 | Wood et al. |
| 5,276,955 A | 1/1994 | Noddin et al. |
| 5,341,979 A | 8/1994 | Gupta |
| 5,346,857 A | 9/1994 | Scharr et al. |
| 5,369,545 A | 11/1994 | Bhattacharyya et al. |
| 5,397,997 A | 3/1995 | Tuckerman et al. |
| 5,408,190 A | 4/1995 | Wood et al. |
| 5,426,266 A | 6/1995 | Brown et al. |
| 5,435,734 A | 7/1995 | Chow |
| 5,438,224 A | 8/1995 | Papageorge et al. |
| 5,440,241 A | 8/1995 | King et al. |
| 5,447,886 A | 9/1995 | Rai |
| 5,451,274 A | 9/1995 | Gupta |
| 5,468,655 A | 11/1995 | Greer |
| 5,523,586 A | 6/1996 | Sakurai |
| 5,550,407 A | 8/1996 | Ogashiwa |
| 5,675,889 A | 10/1997 | Acocella et al. |
| 5,677,575 A | 10/1997 | Maeta et al. |
| 5,786,271 A | 7/1998 | Ohida et al. |
| 5,821,627 A | 10/1998 | Mori et al. |
| 5,897,341 A | 4/1999 | Love et al. |

FOREIGN PATENT DOCUMENTS

| | | |
|---|---|---|
| JP | 58-25242 | 2/1983 |
| JP | 60-86841 | 5/1985 |

OTHER PUBLICATIONS

Koopman, Nicholas, G., et al., "Chip–to–Package Interconnections," *Microelectronics Packaging Handbook*, pp. 361–391, undated.

Ralls et al., *Materials Science and Engineering*, John Wiley & Sons (1976) pp. 158–159 and 223–226.

Wolf, S., "Silicon Processing for the VLSI ERA," vol. 2, Lattice Press, 1990, p. 337.

*Primary Examiner*—Roy Potter
(74) *Attorney, Agent, or Firm*—TraskBritt

(57) ABSTRACT

The invention disclosed herein is a semiconductor die assembly and method of making the same having a die and insert substrate that are electrically interconnected by diffusing gold bumps attached to the connecting surface of the substrate to aluminum-based bond pads on the die to form a permanent die-to-insert connection. The process for diffusing the gold bumps into the bond pads preferably occurs during a burn-in process wherein pressure and heat are applied to the die/substrate assembly without melting the gold bumps until a permanent die-to-insert substrate connection is properly made.

10 Claims, 5 Drawing Sheets

DIE-TO-INSERT PERMANENT CONNECTION AND METHOD OF FORMING

CROSS-REFERENCE TO RELATED APPLICATIONS

This application is a divisional of application Ser. No. 09/565,862, filed May 5, 2000, pending, which is a continuation of application Ser. No. 08/736,586, filed Oct. 24, 1996, now U.S. Pat. No. 6,133,638, issued Oct. 17, 2000, which is a divisional of application Ser. No. 08/578,493, filed Dec. 22, 1995, now U.S. Pat. No. 5,686,318, issued Nov. 11, 1997.

BACKGROUND OF THE INVENTION

Field of the Invention: This invention relates generally to die-to-insert interconnections and, more specifically, to a method of forming a permanent die-to-insert electrical connection for a semiconductor die assembly by diffusing gold bumps on the insert into the bond pads of the die using relatively low elevated temperatures and low levels of constant force during the extended time of a burn-in process.

State of the Art: Currently, there are three primary chip-level interconnection technologies in practice. They include wirebonding (WB), Tape Automated Bonding (TAB), and Controlled Collapse Chip Connection (C4). The method used to bond the interconnections is dependent upon the number and spacing of input/output (I/O) connections on the chip and the insert (i.e., substrate) as well as permissible cost.

WB is the most common chip-bonding technology because the required number of chip connections in many products can be accomplished in addition to providing the lowest cost per connection. WB is generally employed to electrically connect chips to the inner ends of the leads of a lead frame, the assembly subsequently being packaged as by transfer molding of a plastic package. For chips requiring more than 257 but less than 600 connections, TAB may be used. TAB employs lead frames of a finer pitch mounted on an insulative carrier tape which is integrated into the chip package. The C4 process, however, is capable of creating up to 16,000 connections per chip (or partial wafer), potentially meeting the demand for any number of connections that the die or partial wafer design dictates.

When C4 bonding is employed, the entire surface of the chip is normally covered with bond pads for the highest possible I/O count. Solder bumps are deposited on wettable metal terminals (bond pads) on the chip, and a matching footprint of solder-wettable terminals is located on the substrate. Both the bond pads and the terminals must be treated with solder flux. Moreover, the solder bumps must be constrained from completely collapsing (or flowing out onto the substrate bonding site) by using thick-film glass dams, or stops. The tendency for the solder to flow on the chip is contained by a special bonding pad metallurgy that consists of a circular pad of evaporated chromium, copper, and gold. The bond pad metallurgy is then coated by evaporation with, for example, 5Sn–95Pb or 2Sn–98Pb, to a thickness of 100 to 125 µm. Finally, the upside-down chip or die (flip-chip) is aligned to the substrate, and all chip-to-substrate conductive paths are made simultaneously by reflowing the solder.

The numerous process steps and extensive prebond preparation associated with C4 makes it an expensive bonding method. Moreover, because of the expense added by the C4 process, bumping the chip has been avoided. In the Very Large Scale Integration (VLSI) era, however, the expense has been necessary to obtain the required number of connections.

As disclosed in U.S. Pat. No. 5,435,734 to Chow, pressure contact interconnect methods are also known in the art. Pressure contacts are not actually bonded but rather form a continuous contact using a material deformation concept such as a metal spring or an elastic retainer. For example, two gold bumps (on chip and substrate) may be joined by a conductive rubber contact embedded in a polyamide carrier. However, this is a mechanically created connection and is, therefore, not as desirable as metallurgical bonding techniques for economic- as well as reliability-associated reasons.

Furthermore, all of the previously mentioned methods of forming chip-to-substrate interconnections are typically effected after a burn-in operation is performed on the chip to determine if the chip is defective. For burn-in, a chip is typically placed in a multi-chip carrier in resiliently biased or other temporary connection to a burn-in die or substrate (also called an insert) having circuit traces and contacts for electrical testing of the chip. During the burn-in process, the chips are generally subjected to electrical impulses and elevated temperatures (on the order of 125–150° C.) for extended periods of time, usually 24–48 hours, depending upon the chip and the characterization protocol. Low-temperature cycling to as low as −50° C. may also be employed on occasion, particularly for chips being qualified to military specifications. However, this is not common for chips destined for use in commercial applications.

If not proven defective, the chip is removed from its test fixture after burn-in and is then permanently attached to a substrate by means known in the art, such as those previously mentioned. Alternatively, the chip may be wirebonded to a lead frame or TAB-bonded to a taped lead frame, as known in the art, depending upon the ultimate application for the chip and preferred packaging for that application. In any case, burn-in connections and permanent operational connections are effected in the prior art in two distinct and different operations. While it would be possible to form permanent die-to-insert connections before burn-in, this would increase processing time and cost. It is known to package single die before burn-in, such as with wire- or TAB-bonded lead frame-mounted, plastic-packaged dice (e.g., DIP, ZIP), but such arrangements are not suitable for multi-chip modules (MCM's) such as single in-line memory modules (SIMM's) where failure of a single die will result in scrapping of the module.

Thus, it would be advantageous to provide an economical method of chip-to-substrate interconnection that is capable of keeping up with the ever-increasing requirements for more I/O connections per chip, does not require all of the preparation and process steps associated with C4 chip interconnections such as application of flux and the use of thick-film glass substrate dams, and removes at least one major step from the manufacturing process through use of a one-step chip-to-substrate electrical connection technique suitable for both burn-in and ultimate first-level packaging of a chip.

Additional non-C4 ball- or bump-type chip-to-substrate electrical interconnect systems exist in the art, as disclosed in U.S. Pat. Nos. 5,451,274; 5,426,266; 5,369,545; 5,346,857; and 5,341,979. Such systems achieve electrical connections through use of relatively complex and sophisticated apparatus and process methodology, and thus are not suitable for use during chip burn-in in a carrier or other fixture.

Temporary chip-to-burn-in die or insert connections are also known in the art and exemplified by the disclosures of U.S. Pat. Nos. 5,440,241; 5,397,997; and 5,249,450. None of the foregoing patents, however, discloses a methodology for forming suitably permanent die-to-substrate electrical connections during burn-in.

It is known in the electronics art to employ diffusion bonding to effect electrical connections between two or more substrates or circuit boards; U.S. Pat. No. 5,276,955 discloses such a process. However, diffusion bonding as known in the art is generally effected at relatively high temperatures just below the eutectic or peritectic temperatures of the bonding alloy, and for relatively short periods of time, such as one or two hours. Thus, state-of-the-art diffusion bonding as known to the inventors has no legitimate application to making chip-to-insert connections.

BRIEF SUMMARY OF THE INVENTION

According to the invention, a method for forming a permanent chip-to-insert interconnection is herein disclosed. Gold bumps are attached to ends of conductive circuit traces on one side or the other of a nonelectrically conductive substrate, or even the exposed ends of internal conductors, by which electrical testing of a chip during burn-in is effected. As used herein, it should be understood that the term "gold" includes not only elemental gold, but gold with other trace metals and in various alloyed combinations with other metals as known in the semiconductor art. Typically, the die has bond pads on one surface (commonly termed the "front" or "active" surface) formed of aluminum or an aluminum alloy. The bond pads are arranged as a mirror image of the gold bumps located on the surface of the substrate. Thus, when the bond pads are placed on top of the gold bumps, they are in substantial alignment with each other.

The substrate material is selected such that the coefficient of thermal expansion (CTE) is similar to that of the die or semiconductor chip. This assures that both the substrate and the die expand and contract in a similar manner when subjected to elevated temperatures during a burn-in process so that the bond pads on the die will stay in relatively precise alignment with the gold bumps on the substrate, producing little or no shear force between any bond pad and its corresponding bump. By way of example only, the substrate may be comprised of Mullite, a ceramic material such as 203 aluminum oxide, or any other material known in the art that has a CTE similar to that of the die.

By applying a force to the die as it is located above and parallel to the plane of the substrate, the bond pads and gold bumps are pressed together. The die/substrate assembly is then heated to effect a bond between the conductive paths of the two components of the assembly. The heat applied, however, is not sufficient to melt the gold bumps or even to approach the eutectic or peritectic threshold of the gold, but only to the extent necessary to diffuse the gold to form a permanent aluminum/gold bond between the gold bump and the aluminum bond pad. Thus, the gold from the gold bump diffuses into the aluminum bond pads of the die.

The method herein disclosed is preferably performed during the burn-in process. During the heating cycle, the temperature can be set or cycled to provide the necessary diffusion energy to form the aluminum/gold bond. Moreover, the chips may be placed in chip carriers which utilize a spring or other biasing member to press the bond pads of the semiconductor die and the gold bumps of the substrate (burn-in die, insert) together. The assemblies are then subjected to selected temperatures for a selected period of time, the combination of temperature and time promoting diffusion of the gold into the aluminum bond pads of the die.

Contrary to prior art diffusion bonding methods, the diffusion temperature of the present invention is markedly lower, and the diffusion time markedly longer. Of course, were this not the case, the semiconductor die circuitry, if not the die itself, would be damaged and its performance characteristics altered.

Since there is an initial biased electrical contact as soon as the die under test (DUT) is secured against the gold bumps of the substrate in the carrier, electrical testing with elevated potentials as well as thermal testing of the die may commence immediately and continue while the permanent, bump-to-pad diffusion bond is created. Each die that fails during the burn-in process may then simply be discarded at the termination of burn-in along with its attached substrate for recovery of the precious metals. Alternatively, the die may be mechanically removed and a new die attached to the die location on the substrate. It has been found to be, in terms of processing time versus ultimate yield, less expensive to form a permanent chip-to-substrate attachment during burn-in than to perform burn-in followed by a permanent chip attachment to a second substrate, even if some dice have to be pulled as defective or substandard and replaced.

An added advantage of the method of chip-to-substrate interconnection of the present invention is its capability of keeping up with the requirements for ever-increasing numbers of I/O connections, the reduction of process and preparation steps in comparison to C4 bonding and other flip-chip bonding systems known in the art, and the deletion of at least one major step from the fabrication, testing and packaging sequence.

BRIEF DESCRIPTION OF THE SEVERAL VIEWS OF THE DRAWINGS

The present invention will be more fully understood and appreciated by those of ordinary skill of the art by a review of this specification, taken in conjunction with the appended drawings, wherein.

DETAILED DESCRIPTION OF THE INVENTION

Figure 1:
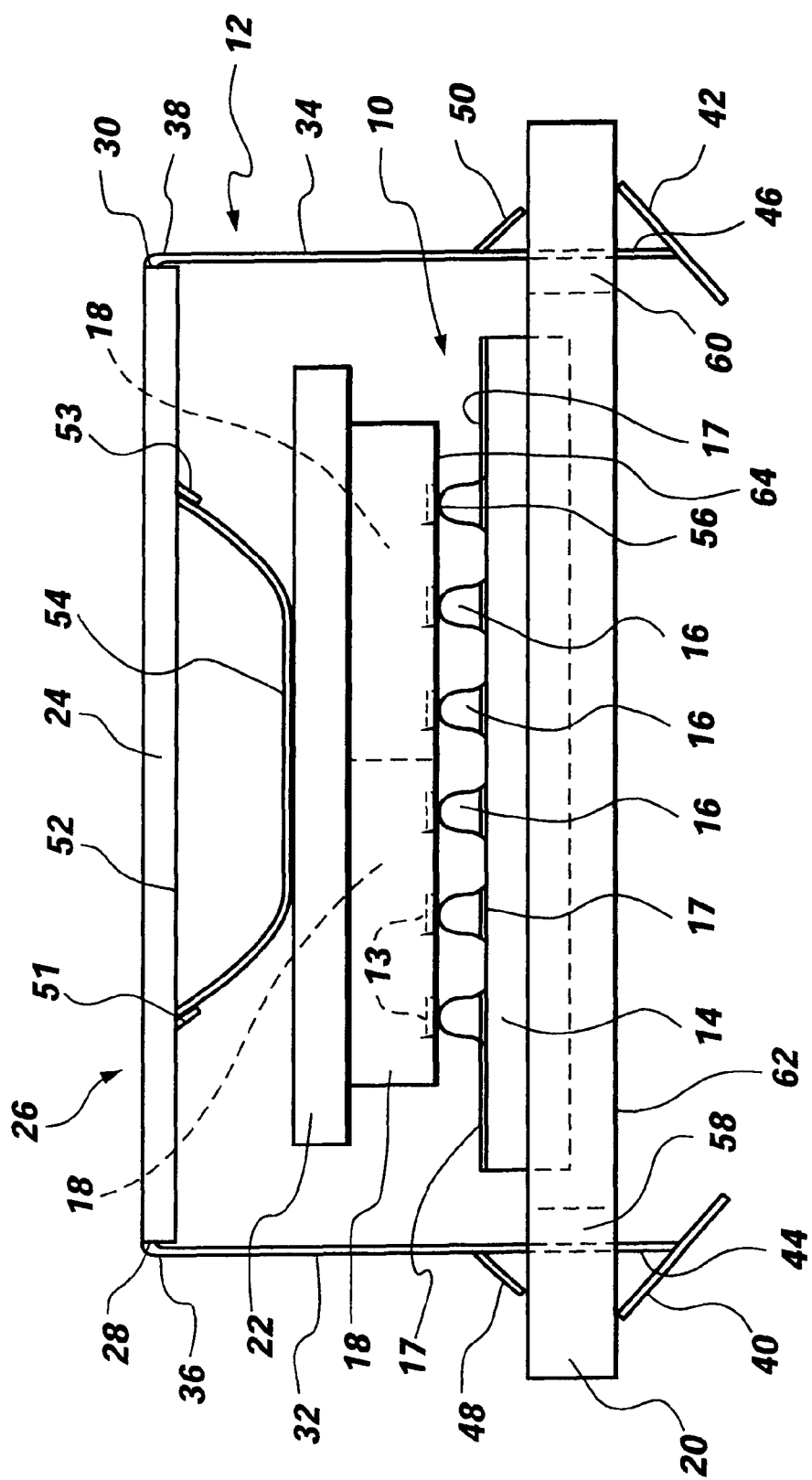
FIG. 1 is a side view of a semiconductor die contained against a gold-bumped substrate in a burn-in fixture in accordance with the method of the present invention.

Referring to FIG. 1, a side view of a semiconductor die assembly 10 positioned in a burn-in fixture 12 is shown. The term "die" as used herein may denote a single die (chip) from a wafer or a plurality of dies, up to an entire wafer if wafer-scale integration is employed for the unit under test.

Figure 2:
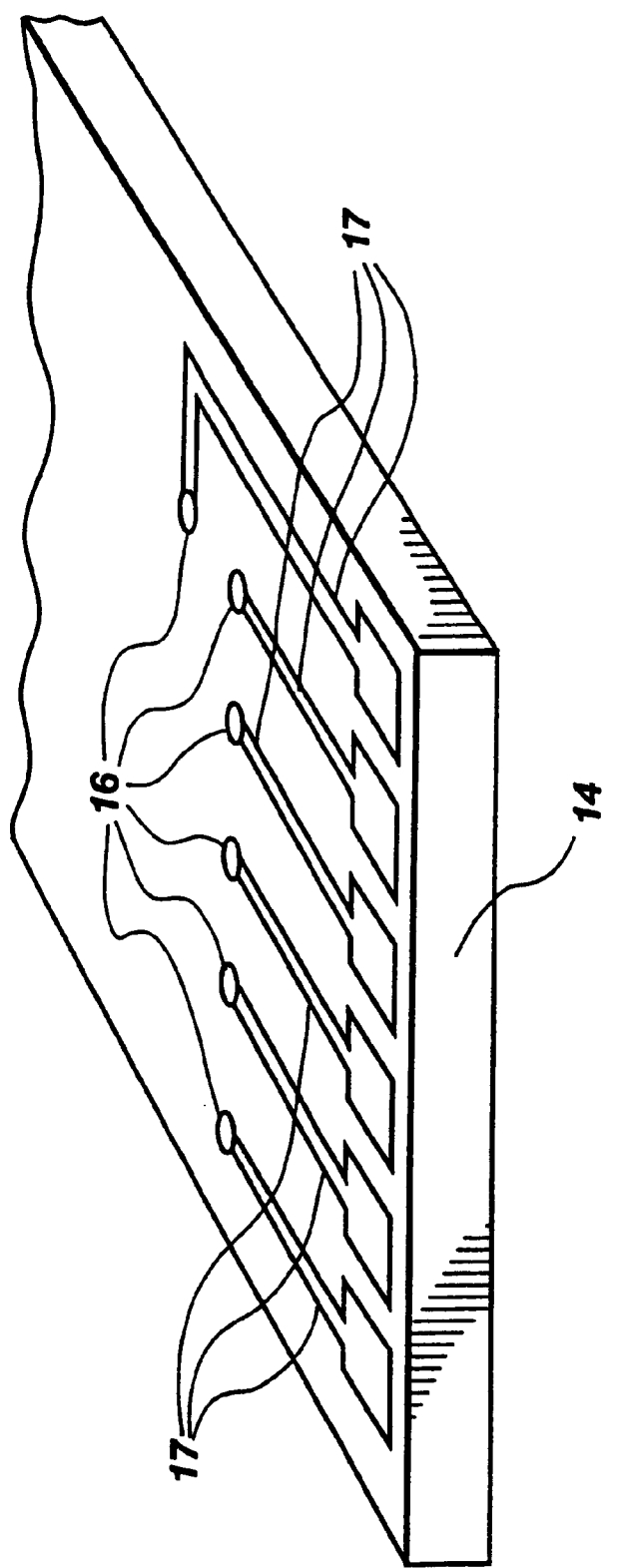
FIG. 2 is a partial top perspective view of a gold-bumped substrate showing circuit traces thereon.

The semiconductor die assembly 10 is comprised of a nonelectrically conductive substrate 14 (also commonly termed an insert or burn-in die in the prior art) on which a plurality of gold bumps 16 is formed by means known in the art. The bumps 16 are located at the ends of circuit traces 17 extending to the periphery of the substrate 14 for electrical testing during burn-in (see FIG. 2). One suitable means of forming gold bumps on substrate 14 is through use of a thermosonic gold wire bonding apparatus as known in the art and commercially available from Kulicke and Soffa Industries of Willow Grove, Pa. The bumps may be coined to a desired configuration after deposition, as known in the art. (See U.S. Pat. Nos. 5,397,997 and 5,249,450 for a discussion of various bump-forming techniques.) The preferred compositions of the gold bumps employed in the present invention may comprise 99.99% pure gold (Au) bond wire, as well as Be- or Cu-doped Au, or other Au-based alloys as known in the art. Aluminum (Al) wire may also be used to form the bumps, using ultrasonic apparatus as known in the art.

At least one semiconductor die 18 with active and optionally passive components, as well as circuit traces, vias and other conductive paths as known in the art, is positioned on top of the gold bumps 16. The substrate 14 is placed in the base 20 of the burn-in fixture 12 with the gold bumps 16 facing upwardly, away from the base 20. The die 18 is aligned with the substrate 14 (the die and substrate planes being mutually parallel and die and substrate electrical contacts being coincident) and a lid or cover 22 is placed on top of the die 18. As also shown in FIG. 1 in broken lines, a plurality of semiconductor dice 18 in the form of a partial or full wafer may be assembled in semiconductor die assembly 10.

Figure 4:
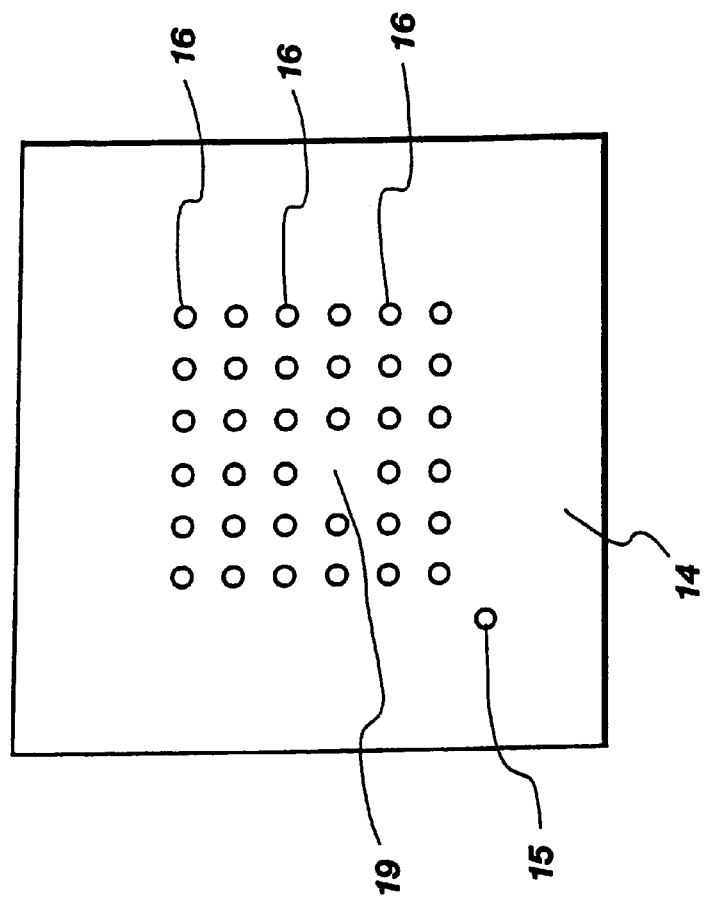
FIG. 4 is a schematic top view of a gold-bumped burn-in substrate suitable for use in accordance with the present invention.
Figure 3:
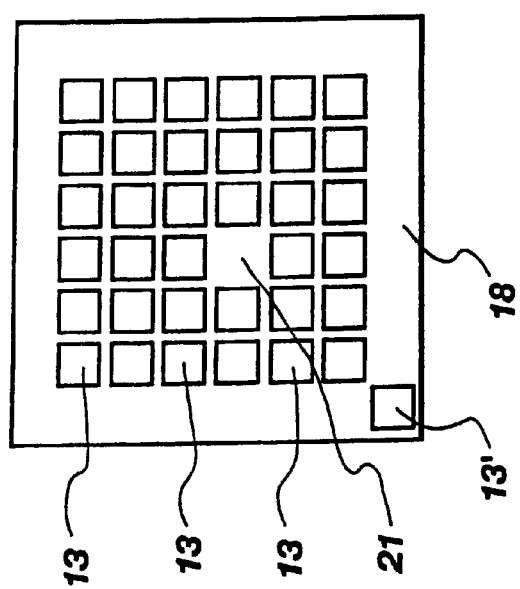
FIG. 3 is a schematic view of the active surface of a high bond pad density semiconductor die suitable for use in accordance with the present invention.

As better seen in FIGS. 3 and 4, the die 18 has a plurality of bond pads 13 in the same configuration as the gold bumps 16 on the substrate 14. Thus, when the die 18 is placed on the substrate 14, the bond pads 13 and the gold bumps 16 match. Moreover, for alignment purposes, one gold bump 15 may be offset from the rest, leaving a space 19 on the substrate bond surface, and one bond pad 13' offset from the rest of the bond pads 13, leaving a space 21 corresponding to the space 19. Thus, correct rotational orientation of the die 18 relative to the substrate 14 can be easily ascertained. Spaces 19 and 21 may, of course, be eliminated and a bump 16 and bond pad 13 merely offset in alignment. Of course, other alignment methods known in the art, such as marking the components for alignment or creating a die/substrate interconnect pattern which can only be mated in one orientation, may also be employed.

Figure 5:
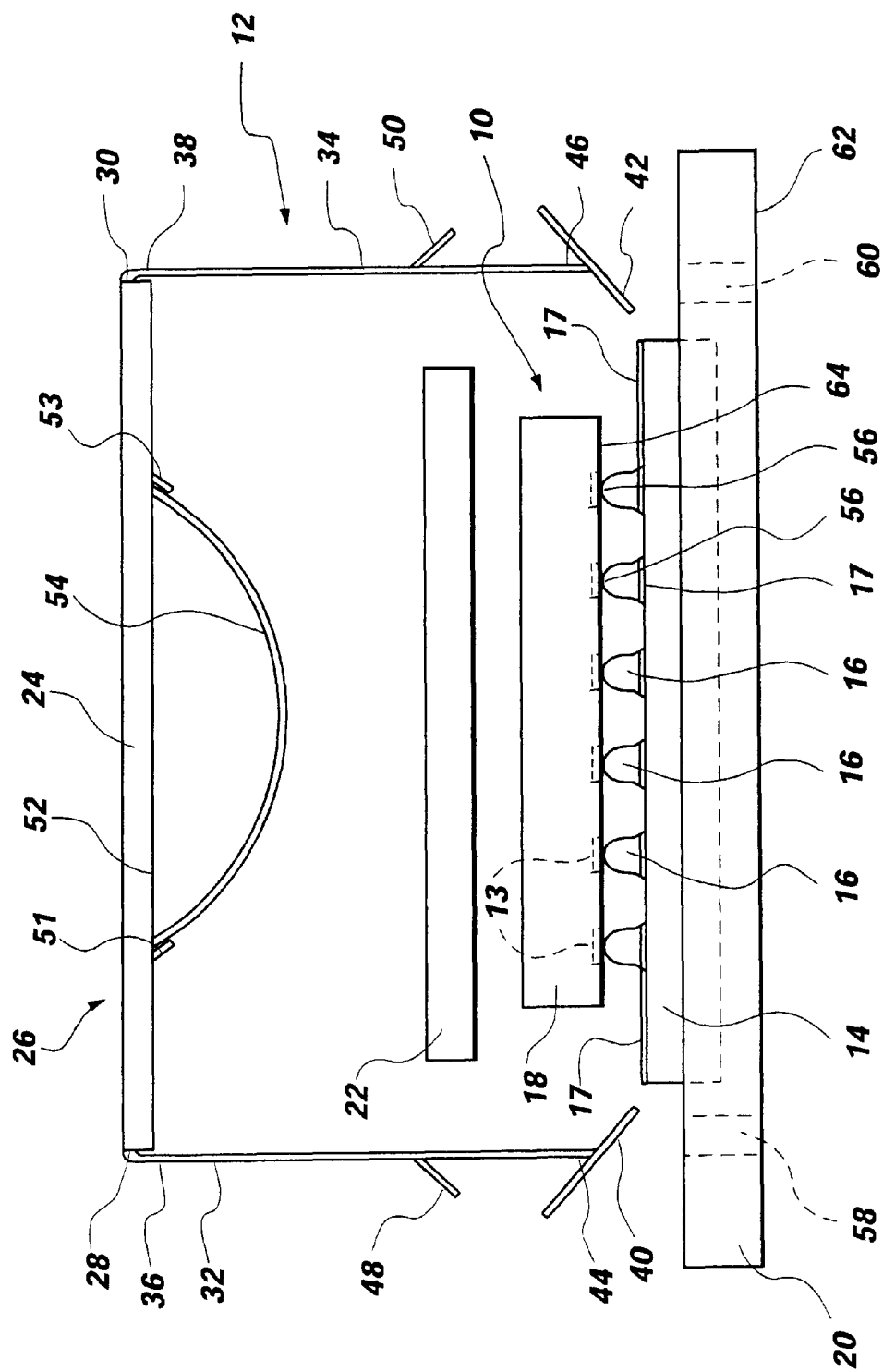
FIG. 5 is an exploded side view of the semiconductor die, burn-in substrate and burn-in fixture of the embodiment shown in FIG. 1.

As shown in FIGS. 1 and 5, the bridge clamp 24 of the burn-in fixture 12 comprises an upper plate 26 having a first end 28 and a second end 30 to which perpendicularly extending legs 32 and 34 are attached about their proximal ends 36 and 38, respectively. The legs 32 and 34 have anchors 40 and 42 resiliently disposed at the distal ends 44 and 46 of the legs 32 and 34, respectively. Spaced upwardly from the anchors 40 and 42 are stop members 48 and 50 extending outwardly from legs 32 and 34.

Attached to the underside 52 of the bridge clamp 24 is a biasing member 54. The biasing member 54 may be comprised of spring steel and configured as a leaf spring, coil spring or Belleville spring, or be formed of some other resilient material known in the art and capable of withstanding the elevated burn-in temperatures, such as a silicone-based elastomers. The biasing member 54 should also be designed to apply a selected amount of force to the back side of die 18 when the burn-in fixture 12 is closed, within a broad range capable of providing sufficient force for bonding contact but not excessive, damaging force to the die 18, the bumps 16, or the substrate 14. The biasing member 54 as shown is held in position by projections 51 and 53 extending from the underside 52 of the bridge clamp 24. The projections 51 and 53 are angled inwardly toward one another and provide for an abutment of the biasing member 54. Other connection means are possible and contemplated, including a tab or extension of biasing member 54 sliding into slots in bridge clamp 24.

The burn-in fixture 12 is designed to apply pressure to the interfaces 56 between the gold bumps 16 and the die 18 transversely to the planes of the die 18 and substrate 14. As shown in FIG. 5, the anchors 40 and 42 are deflected and inserted through slots 58 and 60. The stop members 48 and 50 prevent the legs 32 and 34 from being inserted too far into the slots 58 and 60 and thus prevent excessive force from being applied by the biasing member 54 on the lid or cover 22.

When the anchors 40 and 42 are properly secured to the bottom 62 of the base 20, a predetermined amount of force is applied by the biasing member 54 to the surface of the lid or cover 22. Because the lid or cover 22 substantially covers the die 18 and is of sufficient strength to resist bending or other deflection (FIGS. 1 and 6), the lid or cover 22 provides uniform pressure across the surface 64 of the die 18. Moreover, the pressure may be sufficient to ensure that all of the gold bumps 16 are held in contact with the bond pads 13 on the surface 64 of the die 18.

Figure 6:
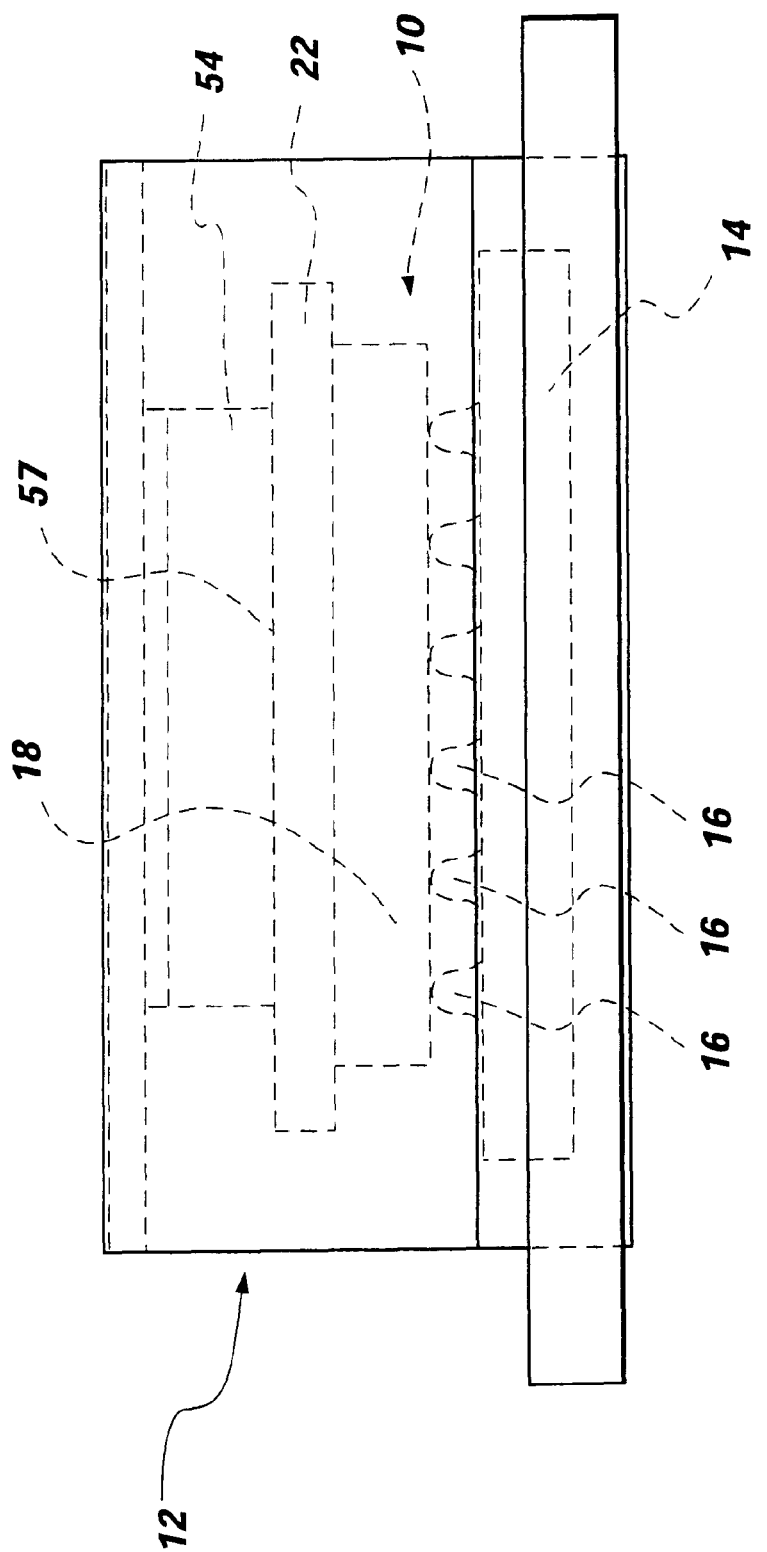
FIG. 6 is an end view of the semiconductor device and burn-in fixture shown in FIG. 1.

FIG. 6 shows the right side end view of the embodiment of FIG. 5. As shown, the biasing member 54 extends over a substantial portion of the lid or cover 22 so that pressure is evenly applied to the top 57 of the lid or cover 22. Because of the even pressure applied to the lid or cover 22 and subsequently between the gold bumps 16 and the bond pads 13, diffusion between all gold bumps 16 and all bond pads 13 under burn-in temperatures can occur substantially simultaneously.

Because of the potential for inherent variation in the height of each gold bump 16, some gold bumps 16 may not initially be in contact with the bond pads 13 of the substrate 14. While solvable through a coining operation as previous mentioned, such an additional process step (if not performed during bump application) may desirably be omitted. Dimensional variation of the substrate-to-die electrical contacts presented substantial problems with the use of prior art burn-in substrates or inserts employing hard, electroplated contact bumps of nonporous nickel. However, as the gold bumps 16 that are in initial contact with the bond pads 13 relax in height slightly as they are compressed during assembly, the distance between the die 18 and the substrate 14 will decrease under the force applied by biasing member 54 until those gold bumps 16 not initially in contact with the bond pads 13 do, in fact, contact and diffuse into the bond pads 13.

The semiconductor die assembly 10 that is contained in the burn-in fixture 12 is subjected to heat during a burn-in process to elevate the assembly 10 to a predetermined temperature above ambient, typically 125–150° C. as previously noted. The burn-in temperature, in combination with the relatively slight temperature elevation of the die due to electrical testing during burn-in, is sufficient to cause the gold of the gold bumps 16 to diffuse into the bond pads 13 of the die 18, but is not high enough to cause the gold in the gold bumps 16 to liquify or to cause damage (beyond the normal purpose of a burn-in to identify defective DUT's) to the DUT. The elevated temperature is maintained for a selected period of time, until burn-in is completed and diffusion of the gold into the bond pads 13 has formed a permanent bond. It should be noted that certain semiconductor devices have recently been developed for operation at elevated temperatures, such as 180° C. or slightly higher in applications such as aerospace or oil and gas exploration. Burn-in for such chips would naturally be conducted at temperatures higher than 150° C., but still far short of the melting point of gold or most gold alloys. Thus, diffusion bonding according to the present invention would have equal utility for such chips.

The time required for sufficient diffusion bonding of the gold bumps of elemental gold or a given alloy to the bond pads can readily be determined, both mathematically and empirically, based on the bump metal or alloy employed and the temperature selected during which the die is biased against the adjacent, parallel substrate. The higher the temperature, the faster the diffusion rate. Thus, for a higher temperature, less time is required for the desired diffusion to occur for any given bump metal.

While the present invention has been described in terms of certain preferred embodiments, it is not so limited, and those of ordinary skill in the art will readily recognize and appreciate that many additions, deletions and modifications to the embodiments described herein may be made without departing from the scope of the invention as hereinafter claimed. For example, a plurality of dice may be simultaneously bonded to a like plurality of substrates in a carrier during burn-in; while the term gold "bumps" has been employed, that term may encompass gold balls, cylinders, cuboids, pyramids or cones (including truncated such structures); the term "bond pad" is intended to include and encompass all suitable terminal structures to which a diffusion bond may be made, including both elevated and recessed bond pads as well as flat, concave or convex bond pads and other terminal structures; and bond pads may be formed of gold-compatible materials other than aluminum.

What is claimed is:

1. A semiconductor die assembly, comprising:
   a substrate having a surface;
   a plurality of conductive bumps attached to the surface of the substrate, each of the plurality of conductive bumps comprised of a first material; and
   a plurality of semiconductor dies having a plurality of bond pads corresponding to the plurality of the conductive bumps, each of the plurality of bond pads comprised of a second material, each of the plurality of bond pads secured to a corresponding conductive bump of the plurality of conductive bumps by a noneutectic, nonalloy-forming, low-temperature diffusion bond, the noneutectic, nonalloy-forming, low-temperature diffusion bond formed at a temperature less than approximately 180° C.

2. The semiconductor die assembly of claim 1, wherein the substrate and the plurality of semiconductor dies have coefficients of thermal expansion to maintain the plurality of bond pads and corresponding conductive bumps in alignment.

3. The semiconductor die assembly of claim 1, wherein the substrate comprises a ceramic material.

4. The semiconductor die assembly of claim 1, wherein the noneutectic, nonalloy-forming, low-temperature diffusion bond is temperature-induced.

5. The semiconductor die assembly of claim 4, wherein the noneutectic, nonalloy-forming, low-temperature diffusion bond securing each of the plurality of bond pads to a corresponding conductive bump of the plurality of conductive bumps is formed with the substrate and plurality of semiconductor dies in mutually convergently biased contact through the plurality of conductive bumps and the plurality of bond pads.

6. The semiconductor die assembly of claim 1, wherein the plurality of semiconductor dies comprises at least a portion of a wafer.

7. The semiconductor die assembly of claim 1, wherein:
   the first material of the plurality of conductive bumps comprises gold;
   the second material of the plurality of bond pads comprises aluminum; and
   the noneutectic, nonalloy-forming, low-temperature diffusion bond of the plurality of bond pads and plurality of conductive bumps comprises essentially diffused gold and diffused aluminum.

8. A semiconductor die assembly, comprising:
   a nonconductive substrate including a plurality of circuit traces respectively extending to a plurality of corresponding conductive bumps having a melting temperature and located on a surface of the nonconductive substrate; and
   a plurality of semiconductor dies having a plurality of bond pads having a melting temperature and located on a surface thereof in proximity to the nonconductive substrate surface, the plurality of bond pads respectively bonded to corresponding conductive bumps of the plurality of corresponding conductive bumps by a noneutectic, nonalloy-forming, low-temperature diffusion bond, the noneutectic, nonalloy-forming, low-temperature diffusion bond formed at a temperature less than the melting temperature of the plurality of conductive bumps and less than the melting temperature of the plurality of bond pads, and wherein the temperature of the noneutectic, nonalloy-forming, low-temperature diffusion bond is less than approximately 180° C.

9. The semiconductor die assembly of claim 8, wherein the plurality of conductive bumps comprises gold, the plurality of bond pads comprises aluminum, and the noneutectic, nonalloy-forming, low-temperature diffusion bond comprises diffused gold and diffused aluminum.

10. The semiconductor die assembly of claim 8, wherein the plurality of semiconductor dies comprises at least a portion of a wafer.

* * * * *